(12) United States Patent
DeBoer et al.

(10) Patent No.: US 6,258,729 B1
(45) Date of Patent: *Jul. 10, 2001

(54) OXIDE ETCHING METHOD AND STRUCTURES RESULTING FROM SAME

(75) Inventors: Scott J. DeBoer; Terry L. Gilton; Ceredig Roberts, all of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/388,685

(22) Filed: Sep. 2, 1999

(51) Int. Cl.[7] .................................................. H01L 21/461
(52) U.S. Cl. ....................... 438/745; 438/700; 438/640; 438/704
(58) Field of Search ..................................... 438/700, 701, 438/704, 737, 745, 640; 216/64, 72, 95, 107, 108, 109

(56) References Cited

U.S. PATENT DOCUMENTS

| | | |
|---|---|---|
| 4,298,443 | 11/1981 | Maydan . |
| 4,978,420 * | 12/1990 | Bach .................................. 156/643 |
| 5,270,241 | 12/1993 | Dennison et al. . |
| 5,392,189 | 2/1995 | Fazan et al. . |
| 5,478,776 * | 12/1995 | Luftman et al. ...................... 437/163 |
| 5,843,845 * | 12/1998 | Chung ................................... 438/713 |
| 5,858,834 * | 1/1999 | Hirota et al. ......................... 438/253 |
| 5,880,036 * | 3/1999 | Becker et al. ........................ 438/740 |
| 5,885,865 * | 3/1999 | Liang et al. .......................... 438/253 |
| 5,893,757 * | 4/1999 | Su et al. ............................... 438/713 |
| 5,962,345 * | 10/1999 | Yen et al. ............................. 438/709 |
| 5,981,401 * | 11/1999 | Toker et al. .......................... 438/745 |
| 5,986,301 * | 11/1999 | Fukushima et al. ................. 257/306 |
| 5,994,209 * | 11/1999 | Yieh et al. ............................ 438/541 |
| 5,994,237 * | 11/1999 | Becker et al. ........................ 438/734 |
| 6,080,664 * | 7/2000 | Huang et al. ........................ 438/638 |

* cited by examiner

Primary Examiner—Matthew Smith
Assistant Examiner—Renzo N. Rocchegiani
(74) Attorney, Agent, or Firm—Mueting, Raasch & Gebhardt, P.A.

(57) ABSTRACT

An etching method includes providing a first insulating material layer on a substrate assembly surface and a second insulating material layer on the first insulating material layer. The first insulating material layer has an etch rate that is greater than the etch rate of the second insulating material layer when exposed to an etch composition. Portions of the first insulating material layer and the second insulating material layer are removed using at least the etch composition. Various types of structures (e.g., contacts, capacitors) are formed with use of the method.

36 Claims, 8 Drawing Sheets

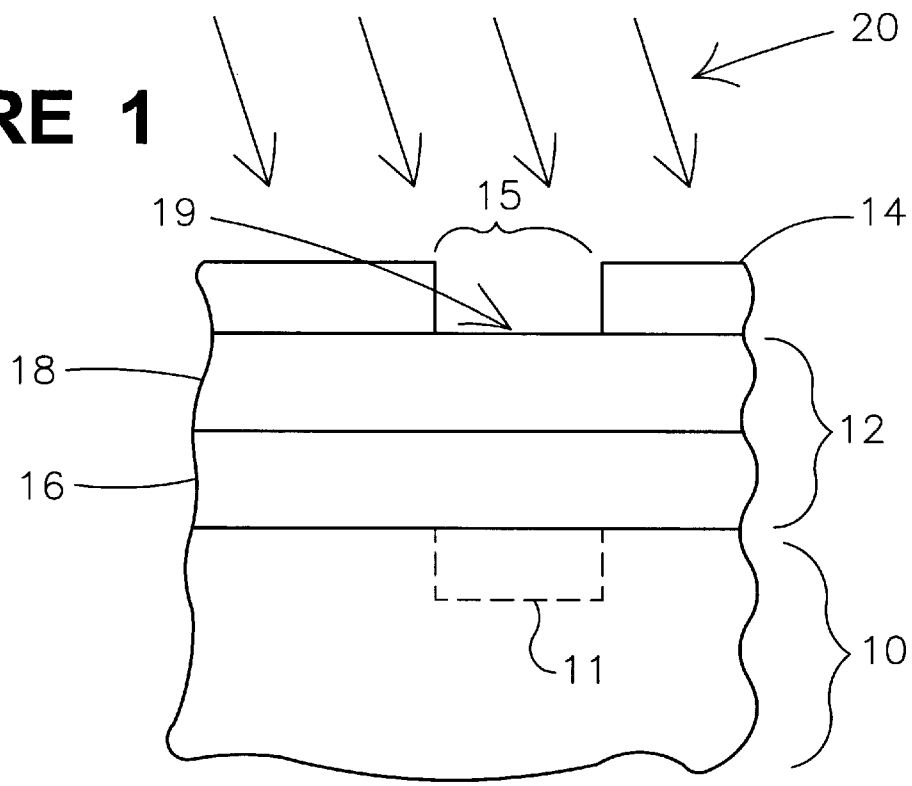
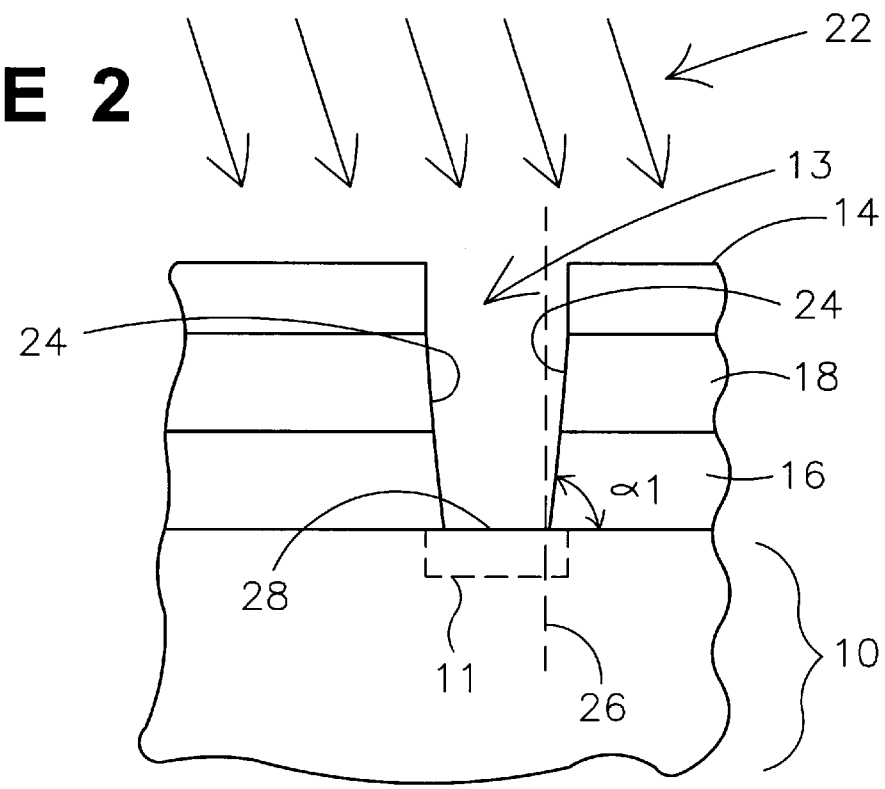

OXIDE ETCHING METHOD AND STRUCTURES RESULTING FROM SAME

FIELD OF THE INVENTION

The present invention relates to semiconductor fabrication methods. More particularly, the present invention pertains to oxide etching methods for use in profile improvement in the formation of structures, e.g., high aspect ratio structures.

BACKGROUND OF THE INVENTION

Various etching processes are used in the fabrication of semiconductor devices. Such etching processes are used to control and maintain critical dimensions of various device structures such as, for example, transistors, capacitors, and interconnects. As semiconductor devices become more integrated and miniaturized, the maintenance and control of such critical dimensions of device structures becomes more important.

During the formation of semiconductor devices, such as dynamic random access memories (DRAMs), static random access memories (SRAMs), microprocessors, etc., insulating layers such as silicon dioxide, phosphosilicate glass (PSG), borophosphosilicate glass (BPSG), TEOS, or other oxides, are etched to form insulating structures, e.g., openings, used for various purposes. Such purposes may include the formation of capacitor structures, contact structures, interconnect structures, etc.

For example, with respect to interconnect structures, it is often required that conductive layers be interconnected through openings or holes in an insulating layer. Such holes or openings are commonly referred to as contact openings when the hole extends through an insulating layer to an active device area or vias when the hole or opening extends through an insulating layer between two conductive layers.

Further, for example, in the formation of certain types of capacitors, openings in insulating layers may be formed such that a capacitor structure may be formed therein. One illustration of such a capacitor structure is described in U.S. Pat. No. 5,392,189 to Fazan, et al., entitled "Capacitor Compatible With High Dielectric Constant Materials Having Two Independent Insulating Layers And The Method For Forming Same," issued Feb. 21, 1995. In this illustrative capacitor example, a storage cell capacitor is provided wherein electrodes are formed of a conductive material within high aspect ratio openings in an opening defined by a bottom surface and side walls in an insulating layer.

The profile of such structures is of particular importance, for example, such that desired characteristics are exhibited when further processing is carried out relative to the structure. For example, in many circumstances it is preferred to have openings or structures having near vertical profiles, e.g., at least one wall being near vertical. In other words, the slope of the walls defining the openings or structures have a slope that is very close to 90°.

For example, with respect to a contact hole or via, a near vertical wall defining the opening into which conductive material is formed provides a larger area at the bottom of the opening as opposed to an opening defined by walls that are less than vertical. Contact resistance for a contact formed in the opening is sensitive to the area at the bottom of the opening.

Further, for example, with respect to a capacitor structure such as a container capacitor illustratively described in U.S. Pat. No. 5,392,189 to Fazan et al., near vertical walls defining a container opening in which a capacitor structure is formed provides a significant increase in cell capacitance for a given height of a capacitor structure relative to a container opening defined by walls that are less than vertical. For example, an opening defined with near vertical walls extending from a bottom surface will generally provide a greater surface area upon which an electrode of a capacitor can be formed relative to a structure having sloped walls which are less than vertical, e.g., less than 88° slope.

The etching of a structure or opening in an insulating layer, e.g., oxide layer, resulting in walls that are generally near vertical is difficult. This is particularly true with respect to high aspect ratio openings. It is known to utilize dry etch plasmas containing fluorocarbons or hydrofluorocarbons to etch oxides, or other insulating layers, relative to underlying conductive layers, e.g., silicon-containing layers such as doped silicon, polysilicon, or other conductive materials. For example, plasmas containing $CHF_3$, $C_2HF_5$, $CH_2F_2$ and combinations thereof have been used to perform such an etch of insulating layers. Further, other gases may be mixed with the fluorocarbon or hydrofluorocarbon plasmas in the etch process to enhance the etch. For example, argon and helium are commonly used diluents typically used to dilute the chemical species and to stabilize the plasma when generated.

However, use of such conventional dry etch processing (e.g., plasmas containing fluorocarbons or hydrofluorocarbons) to etch openings generally result (at best) in walls which define the opening or structure having a slope of between 85° and about 88° relative to horizontal. Such a profile is, in many circumstances, undesirable when attempting to optimize the characteristics of the structure being formed, e.g., a capacitor, a contact, etc. Such a profile is particularly undesirable with respect to high aspect ratio structures.

SUMMARY OF THE INVENTION

To overcome the problems described above, and provide for profile improvement with respect to insulating structures, e.g., high aspect ratio structures, preferably, a novel insulating layer structure and a combination dry etch and wet etch process is used.

An etching method according to the present invention includes providing a first insulating material layer on a substrate assembly surface and a second insulating material layer on the first insulating material layer. The first insulating material layer has an etch rate that is greater than the etch rate of the second insulating material layer when exposed to an etch composition. Portions of the first insulating material layer and the second insulating material layer are removed using at least the etch composition.

In one embodiment of the method, the first insulating material layer has an etch rate about 1.5 times or more greater than the etch rate of the second insulating material layer when exposed to the etch composition.

In another embodiment of the method, removing portions of the first insulating material layer and the second insulating material layer includes patterning a mask layer over the first and second insulating layers and removing portions of the first and second insulating material layers exposed by the patterned mask layer using a plasma etch resulting in an initial opening therein. The initial opening is defined by at least one wall having a slope of less than about 88 degrees. The method further includes removing portions of the first and second insulating material layers using the wet etch composition to further extend the initial opening such that the slope of the at least one wall is in the range of about 88 degrees to 90 degrees.

In yet another embodiment of the method, the first and second insulating material layers are formed of dissimilar oxide materials, e.g., dissimilar doped silicate glass such as BPSG and PSG, PSG at different dopant levels, BPSG at different dopant levels, etc.

A method of forming an opening according to the present invention includes providing a first insulating material layer on a substrate assembly surface and providing a second insulating material layer on the first insulating material layer. The first insulating material layer has an etch rate that is about 1.5 times or more greater than the etch rate of the second insulating material layer when exposed to a wet etch composition. A mask layer is patterned over the first and second insulating layers. Portions of the first and second insulating material layers exposed by the mask layer are removed using a plasma resulting in an initial opening therein. The initial opening is defined by at least one wall having a slope relative to horizontal. Portions of the first and second insulating material layers exposed by the mask layer are then wet etched using the wet etch composition to further extend the initial opening such that the at least one wall becomes more vertical relative to the horizontal.

In one embodiment of the method, dry etching the first and second insulating material layers includes dry etching the first and second insulating material layers using a fluorine containing plasma.

In other embodiments of the method, the wet etch composition includes an ammonium hydroxide and hydrogen peroxide aqueous solution or a phosphoric acid aqueous solution.

Another etching method according to the present invention includes providing at least two insulating material layers forming a stack of insulating layers on a substrate assembly surface. A first insulating material layer of the stack has an etch rate that is about 1.5 times or more greater than the etch rate of any of the other insulating material layers of the stack of insulating layers when exposed to a wet etch composition. A mask layer is patterned over the stack of insulating layers and portions of the stack of insulating layers exposed by the mask layer are removed using a plasma resulting in an initial opening therein. The initial opening is defined by at least one wall having a slope of less than about 88 degrees. Thereafter, portions of the stack of insulating layers are removed using the wet etch composition to further extend the initial opening such that the slope of the at least one wall defining the initial opening is formed to be in a range of about 88 degrees to 90 degrees.

A method for use in forming a capacitor is also provided. The method includes providing a first insulating material layer on a substrate assembly surface and a second insulating material layer on the first insulating material layer. The first insulating material layer has an etch rate that is about 1.5 times or more greater than the etch rate of the second insulating material layer when exposed to a wet etch composition. A mask layer is patterned over the first and second insulating layers and portions of the first and second insulating material layers exposed by the patterned mask layer are removed using a fluorine containing plasma resulting in an initial opening therein. Thereafter, further portions of the first and second insulating material layers are removed using the wet etch composition to further extend the initial opening such that a slope of at least one wall defining the extended opening is in a range of about 88 degrees to 90 degrees. Thereafter, a first electrode structure is formed in the extended opening, a dielectric layer is formed on at least a portion of the first electrode structure, and a second electrode structure is formed on at least a portion of the dielectric layer.

Yet further, a method for use in forming a contact of a memory device according to the present invention is described. The method includes providing a first insulating material layer on at least a surface of a drain/source of an active area and a second insulating material layer on the first insulating material layer. The first insulating material layer has an etch rate that is about 1.5 times or more greater than the etch rate of the second insulating material layer when exposed to a wet etch composition. A mask layer is patterned over the first and second insulating layer to define a contact opening in the first and second insulating material layers and portions of the first and second insulating material layers exposed by the patterned mask layer are removed using a fluorine containing plasma resulting in an initial opening therein. Thereafter, portions of the first and second insulating material layers are further removed using the wet etch composition to extend the initial opening resulting in the contact opening extending to the semiconductor substrate surface. The slope of at least one wall defining the extended opening is in a range of about 88 degrees to 90 degrees. Thereafter, at least one conductive material is provided in the contact opening.

A semiconductor device structure according to the present invention is also described. The structure includes a first insulating material layer formed on a substrate assembly surface and a second insulating material layer formed on the first insulating material layer. An opening is defined in the first and second insulating material layers. The slope of the at least one wall defining the opening is in a range of about 88 degrees to 90 degrees.

In one embodiment of the structure, the first and second insulating material layers are each formed of dissimilar oxide materials, e.g., the first and second insulating material layers are formed of dissimilar doped silicate glass, one of the first and second insulating material layers is formed of BPSG and the other of the first and second insulating material layers is formed of PSG, both the first and second insulating material layers are formed of PSG but at different dopant levels, both the first and second insulating material layers are formed of BPSG but at different dopant levels, etc.

In another embodiment of structure, the first insulating material layer has an etch rate that is about 1.5 times or more greater than the etch rate of the second insulating material layer when exposed to a wet etch composition, e.g., an ammonium hydroxide and hydrogen peroxide aqueous solution or a phosphoric acid aqueous solution.

Another semiconductor device structure according to the present invention includes at least two insulating material layers forming a stack of insulating layers on a substrate assembly surface. A first insulating material layer of the at least two insulating layers provided on the substrate assembly surface has an etch rate that is about 1.5 times or more greater than the etch rate of any of the other insulating material layers of the stack of insulating layers when exposed to a wet etch composition. An opening is defined in the stack of insulating layers. The slope of at least one wall defining the opening is formed to be in the range of about 88 degrees to 90 degrees.

A capacitor according to the present invention is also described. The capacitor includes a first insulating material layer formed on a substrate assembly surface including a conductive region and a second insulating material layer formed on the first insulating material layer. The first insulating material layer has an etch rate that is about 1.5 times or more greater than the etch rate of the second insulating material layer when exposed to a wet etch composition. An opening is defined in the first and second insulating material layers extending to the conductive region of the substrate assembly surface. A slope of at least one wall defining the opening is in a range of about 88 degrees to 90 degrees. A first electrode structure is formed in the opening with a dielectric layer formed on at least a portion of the first electrode structure. A second electrode structure is provided on at least a portion of the dielectric layer.

A contact for a memory device according to the present invention includes a first insulating material layer formed on a source or drain region of an active area. A second insulating material layer is formed on the first insulating material layer. The first insulating material layer has an etch rate that is about 1.5 times or more greater than the etch rate of the second insulating material layer when exposed to a wet etch composition. A contact opening extends to the semiconductor substrate surface. A slope of at least one wall defining the contact opening is in a range of about 88 degrees to 90 degrees. The contact further includes at least one conductive material in the contact opening.

BRIEF DESCRIPTION OF THE DRAWINGS

FIGS. 1–3 generally illustrate an etching method for providing near vertical profiles in the etching of insulating material structures.

DETAILED DESCRIPTION OF THE EMBODIMENTS

Figure 3:
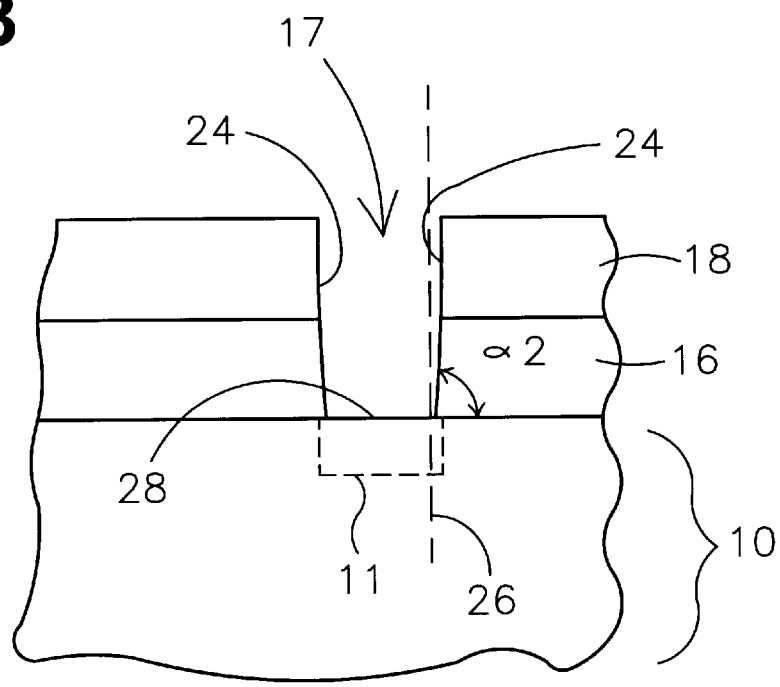

The present invention shall be described generally with reference to FIGS. 1–3. Thereafter, embodiments and illustrations of applications using the present invention shall be described with reference to FIGS. 4A–4C and FIGS. 5A–5C. It will be apparent to one skilled in the art that scaling in the figures does not represent precise dimensions of the various elements illustrated therein.

Generally, the present invention provides for profile improvement of an insulating structure, e.g., high aspect ratio opening in insulating layers, through the use of a stack of insulating material layers modified from conventional insulating layers used in conventional device fabrication and further through the use of a wet etch process in addition to a dry etch process conventionally used to etch conventional insulating layers. Generally, the stack to be etched according to the present invention includes at least two dissimilar insulating material layers, wherein the etch rate of the lower of the at least two dissimilar insulating material layers is greater, preferably about 1.5 times or more greater, than the etch rate of the other insulating material layer(s). Further, generally, this insulating material layer stack is then etched using at least a two-step process. The two-step process includes at least a dry etch to form a structure defined by at least one wall having a first slope and thereafter a wet etch process which extends the etched opening such that straightening of the profile of the wall defining the structure is achieved, preferably to a near vertical profile.

According to the present invention, any improvement of profile using the present invention is contemplated. For example, the improvement of a slope for a wall from 70° (e.g., resulting from a dry etch step) to a slope of 80° after the wet etch is contemplated, as well as improvements in a slope in the range of about 85° to about 88° (e.g., resulting from a dry etch step) to slopes of near vertical. As used herein, near vertical refers to a wall having a slope of greater than about 89°.

FIGS. 1–3 illustrate the profile improvement method according to the present invention. As shown in FIG. 1, an insulating material stack 12 is formed on substrate assembly 10. Substrate assembly 10, as used in this application, refers to either a semiconductor substrate such as a base semiconductor layer, e.g., the lowest layer of silicon material on a wafer, or a silicon layer deposited on other material such as silicon on sapphire, or a semiconductor substrate having one or more layers or structures formed thereon or regions formed therein. When reference is made to a substrate assembly in the following description, various process steps may have previously been used to form or define regions, junctions, structures, or features and openings such as vias, contact openings, high aspect ratio openings, etc.

For example, substrate assembly 10 may be a structure upon which a capacitor is formed. As such, the process according to the present invention is used to define an opening in the insulating material stack 12 in which a bottom electrode of a storage cell capacitor is formed, such as described in reference to FIGS. 5A–5C.

Further, for example, substrate assembly 10 may include a source and/or drain region to which a contact is to be made through the insulating material stack 12. As such, an opening is etched according to the method of the present invention in the insulating material stack 12 to a region to be interconnected using a conductive material, such as described with reference to FIGS. 4A–4C.

The profile improvement method according to the present invention may be used for any application requiring the etching of insulating material to form a structure defined by at least one wall. However, the present invention is particularly beneficial for providing near vertical profiles, and even more beneficial for providing near vertical profiles for high aspect ratio structures such as contact openings or vias, trenches, openings for formation of cell electrodes of capacitors, etc.

As described herein, small high aspect ratio openings have feature sizes or critical dimensions below about 1 micron (e.g., such as diameter or width of an opening being less than about 1 micron) and may have critical dimensions below about 0.5 microns and even below about 0.3 microns. Preferably, such small high aspect ratio openings have aspect ratios greater than about 1 and may further have aspect ratios greater than about 6. Such critical dimensions and aspect ratios are applicable to contact holes, vias, trenches, and any other configured opening or structures. For example, a contact having an opening width of 1 micron and a depth of 3 microns has an aspect ratio of 3.

The insulating material stack 12 includes at least two insulating material layers as generally illustrated by first insulating material layer 16 formed on substrate assembly 10 and second insulating material layer 18 formed on the lower first insulating material layer 16. According to the present invention, the lower first insulating material layer 16 has an etch rate that is greater than the etch rate of the second insulating material layer 18 when exposed to an etch composition. Preferably, the lower first insulating material layer 16 has an etch rate that is 1.5 time or more greater than the etch rate of the second insulating material layer 18 when exposed to the etch composition. When more than two layers are used according to the present invention, preferably, the lower layers of the insulating material stack 12 have an etch rate that is greater than insulating material layers subsequently formed thereover when exposed to the etch composition. As described further below, any suitable etch composition providing such selectivity between the various layers of the insulating material stack 12 may be used according to the present invention.

Preferably, according to the present invention, insulating material stack 12 includes two insulating material layers, the first insulating material layer 16 formed on substrate assembly 10 and second insulating material layer 18 provided on first insulating material layer 16. Although any insulating material may be used to form insulating material layers 16 and 18, preferably, the dissimilar insulating material layers 16, 18 are formed of dissimilar oxide materials such as $SiO_2$, TEOS, BPSG, PSG, doped TEOS (e.g., F-TEOS (fluorine-doped TEOS)), ozone enhanced TEOS, or any other like oxide materials. More preferably, the dissimilar insulating material layers 16, 18 are formed of dissimilar doped silicate glass materials (e.g., PSG, BPSG). For example, one of the first and the second insulating material layers 16, 18 may be formed of PSG and the other formed of BPSG to achieve the desired selectivity.

Further, for example, both the first and second insulating material layers 16, 18 may be formed of PSG at different dopant levels. In other words, one of the layers may be a rich PSG layer while the other may be a standard PSG layer. Generally, a rich PSG layer is defined as a layer having a phosphorous content of about 6.5% or greater, and a standard PSG layer is defined as a layer having a phosphorous content in the range of about 6.0% or less.

Further, for example, both the first and second insulating material layers 16, 18 may be formed of BPSG at different dopant levels. For example, the lower first insulating material layer 16 may be formed of a rich BPSG layer and the second insulating material layer may be formed of a standard BPSG layer. Generally, as defined herein, a rich BPSG layer is a BPSG layer including boron in the range of about 3.0% to about 3.8% and phosphorous in the range of about 6.5% to about 9.0%. Also, as generally used herein, a standard BPSG layer is generally defined as a BPSG layer having a boron concentration of about 3.0% or less and a phosphorous concentration of about 6.0% or less.

Therefore, in summary, the first and second insulating material layers 16, 18 may be any two dissimilar insulating materials where the etch rate of the first insulating material layer 16 is greater than the etch rate of the second insulating material layer 18 when exposed to a particular etch composition, e.g., a wet etch composition such as further described herein. More preferably, the first insulating material layer 16 has an etch rate that is 1.5 times or more greater than the etch rate of the second insulating material layer 18 when exposed to the etch composition. Further, in summary, although any type of dissimilar insulating materials may be used, preferably, the dissimilar insulating material layers are formed of dissimilar oxide materials and, more preferably, are formed of dissimilar doped silicate glass materials.

As will be recognized by one skilled in the art, this multi-layer insulating material stack 12 is generally different and modified from conventional structures used for insulating purposes. Conventionally, insulating material of one type as opposed to multiple layers of dissimilar materials has been used to provide such insulating function.

One skilled in the art will recognize that the insulating material layers 16, 18 and any other layers of the insulating material stack 12 used according to the present invention may be provided by any known method. Various methods are known for forming insulating materials such as different doped BPSG and PSG layers and, as such, further details with regard to such processing shall not be further provided herein.

Further, when one or more of the insulating material layers 16, 18 of insulating material stack 12 are formed of doped silicate glass, typically some processing is required after deposition of such materials. For example, densification steps may be required to densify the doped silicate glass materials. Such densification steps may also be used to provide for further difference in the etch rate between the first and second insulating material layers 16, 18. For example, with use of a rich BPSG layer as the first insulating material layer 16 and a standard BPSG layer as the second insulating material layer 18, the etch rate difference between the two insulating material layers 16, 18 may be increased with the densification of the rich BPSG first insulating material layer 16. Such densification may be provided by rapid thermal processing (RTP) or furnace anneals at conditions required to densify the doped silicate glass as desired. Any difference between the densification processes of one of the layers relative to the other may provide for a further enhancement of the etch rate differences between the two layers.

Although the thickness of the first and second insulating material layers 16, 18 may vary depending upon the desired application, preferably, the thickness of the insulating material stack 12 is generally in the range of about 2000 Å to about 15,000 Å. More preferably, the first insulating material layer 16 is of a thickness in the range of about 2000 Å to about 12,000 Å, and the second insulating material layer 18 has a thickness in the range of about 2000 Å to about 15,000 Å.

With the insulating material stack 12, e.g., first and second insulating material layers 16, 18, provided as shown in FIG. 1, the etch method according to the present invention is performed. Prior to performing the etch, a patterned mask layer 14 is provided over the insulating material stack 12. The patterned etch resistant material, i.e., mask layer 14, is formed over the insulating material stack 12 exposing a portion 19 of the insulating material stack 12 as shown by opening 15 in the mask layer 14. The etch resistant mask layer 14 may be, for example, photoresist or any other mask layer. The patterning of the photoresist or mask layer is performed in a conventional manner and is readily known to one skilled in the art. Preferably, although clearly not necessarily, the insulating material stack 12 is exposed at a portion 19 directly over a surface region 11 of substrate assembly 10 to which the insulating material stack 12 is to be opened. With the substrate assembly 10, the insulating material stack 12, and the patterned mask layer 14 provided, an etch according to the present invention of the exposed portion 19 to define opening 17 in the insulating material stack 12 (shown in FIG. 3) is performed.

As indicated previously, the present invention is particularly beneficial for defining high aspect ratio openings, e.g., contact holes or vias, through the insulating material stack 12 to an underlying material. As such, substrate assembly 10 includes a surface region 11 to which a high aspect ratio opening 17 (shown in FIG. 3) extends. Thus, the opening 17 allows for forming an interconnect, an electrode, etc., relative to surface region 11 of the substrate assembly 10. For example, the surface region 11 may be any silicon containing region, e.g., a doped silicon region or a doped polysilicon region. However, the present invention is in no manner limited to such silicon-containing regions but is limited only in accordance with the accompanying claims. For example, such high aspect ratio features may be formed relative to any surface region 11 (e.g., silicon nitride, metal interconnect layer, metal silicide, dielectric material) of a substrate assembly 10 for use in forming any number of features, such as a contact hole for an interconnect, a gate electrode, a capacitor electrode, a via, etc. It should be recognized that the surface region 11 may be the same or different from the materials or remainder of the substrate assembly 10. For example, the surface region 11 may be of a continuous nature with the remainder of the substrate assembly 10.

The etch, according to the present invention, is generally performed in multiple steps, preferably two steps. The first step is a dry etch generally represented by arrows 20, as shown in FIG. 1, and results in initial opening 13 in the insulating material stack 12. For example, the initial opening 13 may extend to the surface region 11 of substrate assembly 10 or may extend only partially thereto. Generally, the initial opening 13 is defined by at least one side wall 24 extending from a bottom surface 28. Preferably, the bottom surface 28 is a horizontal surface which lies parallel to, for example, a horizontal plane defined by the base wafer being fabricated. The at least one wall 24 generally has a slope ($\alpha$) defined relative to horizontal, e.g., generally defined by a lower surface (e.g., surface 28) of the feature being etched. Dashed line 26, as shown in FIG. 2, shows a vertical line relative to horizontal for reference. Generally, the dry etch 20 provides an initial opening 13 wherein the at least one side wall 24 defining the opening 13 has a first slope ($\alpha 1$). Generally, it will be recognized by one skilled in the art that the dry etch 20 when used, particularly in high aspect ratio opening formation processes, provides for the removal of more material at the upper region of the initial opening 13 as opposed to the bottom region nearer the bottom surface 28, resulting in the slope $\alpha 1$ of the at least one side wall 24.

The second step of the profile improving etch method includes the use of an etch 22, as shown generally in FIG. 2 by arrows 22, which is preferably a wet etch. The wet etch 22 extends the initial opening 13 to form opening 17 as shown in FIG. 3. The opening 17 extends to bottom surface 28 and is defined by the bottom surface 28 and the at least one side wall 24. The at least one side wall having a first slope $\alpha 1$ after the dry etch 20 is straightened by the wet etch 22 such that the slope of the at least one side wall 24 is improved to a more vertical state as shown by slope angle $\alpha 2$ (shown in FIG. 3). The etch 22 includes the use of an etch composition which etches the first and second insulating material layers 16, 18 at different rates. Further, the etch composition is selective to the surface region 11 which acts as an etch stop for the wet etch 22. For example, as previously described, preferably, the etch rate for lower first insulating material layer 16 is 1.5 times or more greater than the etch rate of second insulating material layer 18 when the materials are exposed to the etch composition of wet etch 22. As such, more insulating material of insulating material layer 16 is removed than is removed from the second insulating material layer 18 resulting in a straightening of the at least one wall 24 and an improved profile according to the present invention.

Generally, in summary, the two step process includes a dry etch 20 for removing insulating material to form initial opening 13 defined by at least one wall 24 having a slope of $\alpha 1$. The dry etch 20 is then followed with etch 22 using an etch composition (preferably, a wet etch composition) which provides for etching of the first insulating material layer 16 at a higher rate relative to the dissimilar second insulating material layer 18 such that the slope of the at least one wall 24 is straightened, i.e., $\alpha 2$. The present invention contemplates that any improvement in slope of the at least one wall 24 defining opening 17 or any other structure being formed is beneficial. However, preferably, dry etch 20 is optimized to provide a wall 24 having a slope of less than about 88°, and more preferably in the range of about 85° to about 88°. Thereafter, the preferred wet etch 22 is used to straighten the at least one wall 24 resulting in a slope in the range of about 88° to about 90° (i.e., vertical). More preferably, etch 22 is optimized to result in a near vertical wall or surface as defined herein, i.e., about 89° to about 90° (i.e., vertical).

Although, preferably, a two step etch process is used according to the present invention (e.g., a dry etch followed by a wet etch), more than two etches may be performed. For example, the dry etch may be performed in multiple etch steps, the wet etch may be performed using more than one etch composition, etc.

The dry etch 20 used to remove insulating material to form initial opening 13 may be any dry etch process including physical sputtering, reactive ion etching (RIE), and plasma etching. Preferably, the dry etch 20 is a plasma etch. The plasma etch may performed using any known etching device, such as an etcher available from Applied Materials under the trade designation of P5000 etcher, an apparatus as described in U.S. Pat. No. 4,298,443; a 9100 TCP Oxide Etcher available from Lam Research Corporation; or any other plasma or high density plasma etcher. It should be readily apparent to one skilled in the art that depending upon the particular etching apparatus utilized to generate the plasma, various parameters provided herein may vary for accomplishing similar objectives.

Preferably, the plasma used for the dry etch 20 is generated using one or more fluorocarbon or hydrofluorocarbon gases such as $CHF_3$, $C_2HF_5$, $CH_2F_2$, $CF_4$, $C_2F_6$, $C_3F_8$, or any other carbon and fluorine-containing gases alone or in combination with other gases such as those used for dilution. For example, several diluent gases include rare gases such as helium, argon, xenon, etc. When utilized to generate a plasma, such fluorocarbon or hydrofluorocarbon gases generally disassociate resulting in fragments for use in the etching process. In other words, any fluorocarbon or hydrofluorocarbon feed gases for use in generating $C_xH_yF_z^+$ ions or $C_xF_z^+$ ions may be utilized in accordance with the present invention. It will be recognized by one skilled in the art that various other gases such as hydrogen or oxygen may be utilized with the gases used herein to adjust the nature of carbon and fluorine-containing ions.

Generally, plasma etching systems include an etching chamber that is evacuated to reduced pressures, a pumping system for establishing and maintaining the reduced pressure, pressure gauges to monitor pressure in the chamber, a variable conductance between the pump and etching chamber so that the pressure and flow rate in the chamber can be controlled independently, a power supply for use in creating a glow discharge, a gas handling capability to meter and control the flow of reactant gases to the chamber, and electrodes for supplying the power to the chamber. Depending upon various factors, including which parameters of the process need to be controlled, the systems may take various configurations. The power source utilized may be any suitable power source including an RF generator, a microwave generator, etc. For example, conditions for an etcher such as high density plasma etcher to perform such dry etch processing using fluorocarbon or hydrofluorocarbon components preferably includes:

Power in the range of about 200 watts to about 1000 watts.

Bias power in the range of about 200 watts to about 1000 watts.

Temperature in the range of about 0° C. to about 100° C.

Pressure in the range of about 1 millitorr to about 100 millitorr; more preferably in the range of about 1 millitorr to about 50 millitorr.

Flows of gases into the chamber include: $C_2HF_5$ at a flow rate of about 5 sccm to about 50 sccm, $CHF_3$ at a flow rate of about 5 sccm to about 50 sccm, and $CH_2F_2$ at a flow rate of about 5 sccm to about 50 sccm.

Dry etching of insulating layers 16, 18 preferably removes a substantial amount of the material to form opening 17. However, such dry etching even under optimized conditions results in walls having a slope of, at best, about 88°. For example, such optimum conditions fall in the ranges given above.

The etch 22 used to improve the profile of the initial opening 13 is preferably a wet etch including a wet etch composition that provides for the desired selectivity to the dissimilar first and second insulating material layer 16, 18. For example, any wet etch composition may be used which preferably etches first insulating material layer 16 at a rate greater than the etching of the second insulating material layer 18, more preferably about 1.5 times or more greater than the etching of the second insulating material layer 18. For example, the etch composition may include an ammonium hydroxide and hydrogen peroxide aqueous solution such as an APM etch composition (i.e., 4 $H_2O$:1 AH:1 $H_2O_2$). A wet etch using an APM etch composition may be performed, preferably in a temperature range of about 5° C. to about 90° C. (more preferably in the range of about 45° C. to about 65° C.) for a preferred time period of about 2 minutes to about 30 minutes (more preferably about 5 minutes to about 20 minutes).

Further, for example, a hot phosphoric acid aqueous solution may be used to provide the improved profile with the desired selectivity between the first and second insulating material layers 16, 18. Such a hot phosphoric acid aqueous solution may include about 86% by volume of commercially available phosphoric acid; the phosphoric acid being commercially-available as a concentrated solution (x) typically diluted to desired concentration ($H_2O$:x). For example, commercially-available phosphoric acid is available as 86 percentage by weight in deionized water. Preferably, the phosphoric acid composition is used in a hot phosphoric cleaning process at a temperature in the range of about 155° C. to about 165° C. for a period of time in the range of about 5 minutes to about 20 minutes.

Generally, the wafers being etched using the wet etch composition are generally immersed in the wet etch solution to perform the etching process. However, various other methods such as spraying may be used in addition to agitation devices for enhancing the etching process.

Further, a post-etch clean may be used to clean any residue from the surfaces defining opening 17. For example, an HF clean commonly known to one skilled in the art may be used.

Two illustrations of using the above described profile improvement methods are described below with reference to FIGS. 4A–4C and FIGS. 5A–5C. The use of the etching method according to the present invention is described with reference to FIGS. 4A–4C wherein an opening is formed for use in forming a contact to a source or drain region. Further, the etching method according to the present invention is described with reference to FIGS. 5A–5C wherein an electrode structure of a storage cell capacitor can be formed. For simplicity purposes, only two illustrative structures are described herein. However, there are other semiconductor processes and structures for various devices, e.g., CMOS devices, memory devices, etc., that would benefit from the present invention and in no manner is the present invention limited to the illustrative embodiments described herein, e.g., contact openings and openings for capacitor structures. The present invention may be used whenever an improvement in profile of an insulating material structure is beneficial.

Figure 4A:
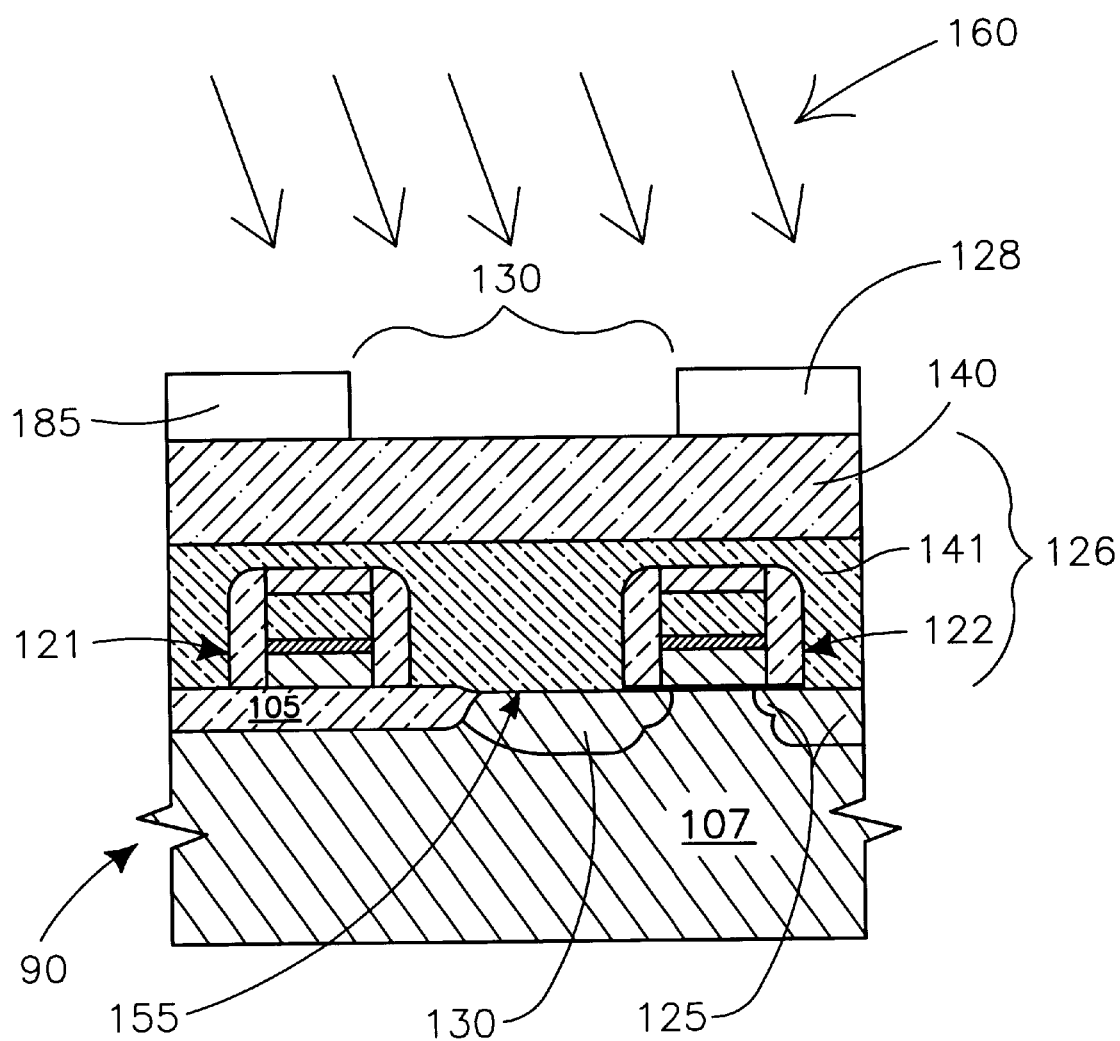
FIGS. 4A–4C illustrate the use of the method according to the present invention in a contact application.
Figure 4B:
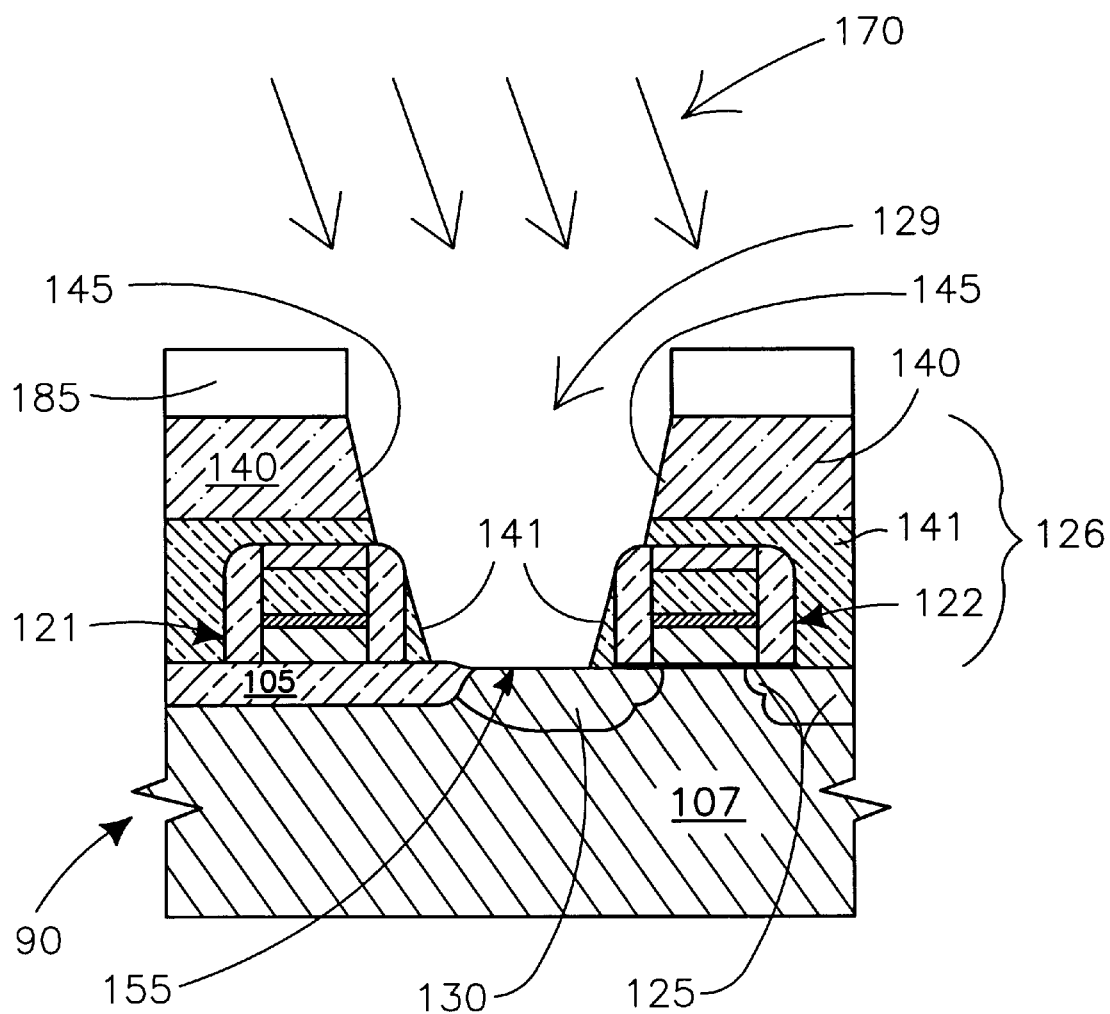
Figure 4C:
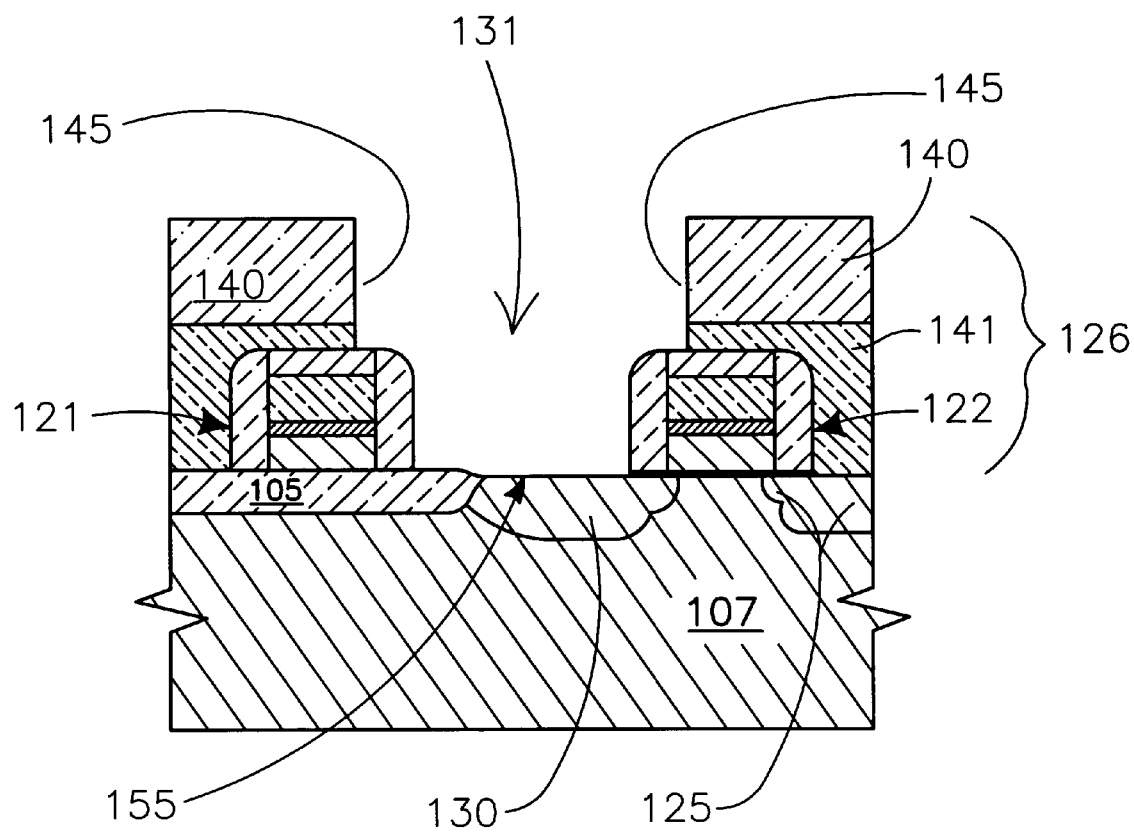

As shown in FIG. 4A, device structure 90 is fabricated in accordance with conventional processing techniques through the formation of word line 121 and field effect transistor 122. As such, prior to formation of insulating material stack 126, including first insulating material layer 141 and second insulating material layer 140, the device structure 90 includes field oxide regions 105 and active areas, i.e., those regions of the substrate 107 not covered by field oxide. Formed relative to the field oxide regions 105 and active areas are the word line 121 and the field effect transistor 122. Doped source/drain regions 125 and 130 are formed as known to one skilled in the art. Insulating material stack 126 is formed over the device structure 90 as shown in FIG. 4A and as previously described herein with reference to FIGS. 1–3. Further, a patterned mask layer 128 is formed over the insulating material stack 126 to define opening 130 therein. Thereafter, the etching method according to the present invention, as previously described herein with reference to FIGS. 1–3, is performed to form opening 131 as shown in FIG. 4C.

According to the present invention, for example, the first and second insulating material layers 140, 141 include dissimilar insulating materials as previously described herein. Further, a first dry etch 160 (as shown in FIG. 4A) is used to form an initial opening 129 (as shown in FIG. 4B). As previously described herein, the walls 145 defining the opening 129 have a first slope which is improved upon by use of the second wet etch process 170 (illustrated in FIG. 4B). The resultant profile after the wet etch process 170 is shown in FIG. 4C. As will be noted, the slope of the walls 145 defining the initial opening 129 as shown in FIG. 4B are substantially improved towards vertical by the wet etch 170 as shown in FIG. 4C. Further, the bottom of the opening 131 used as a contact to region 130 is further opened by the wet etch process 170 such that a larger area represented by bottom surface 155 is provided. Having a larger area of contact provides desirable characteristics in that contact resistance is sensitive to the amount of area in the contact region at the interface between the contact material filling opening 131 and the material of region 130. As such, improvement is provided for a contact formed in opening 131.

After the opening 131 is formed according to the method of the present invention, one or more layers of conductive material may be formed therein. For example, a contact liner may be formed followed by provision of a conductive material into the opening 131 such as shown in FIG. 5A as further described below.

Figure 5A:
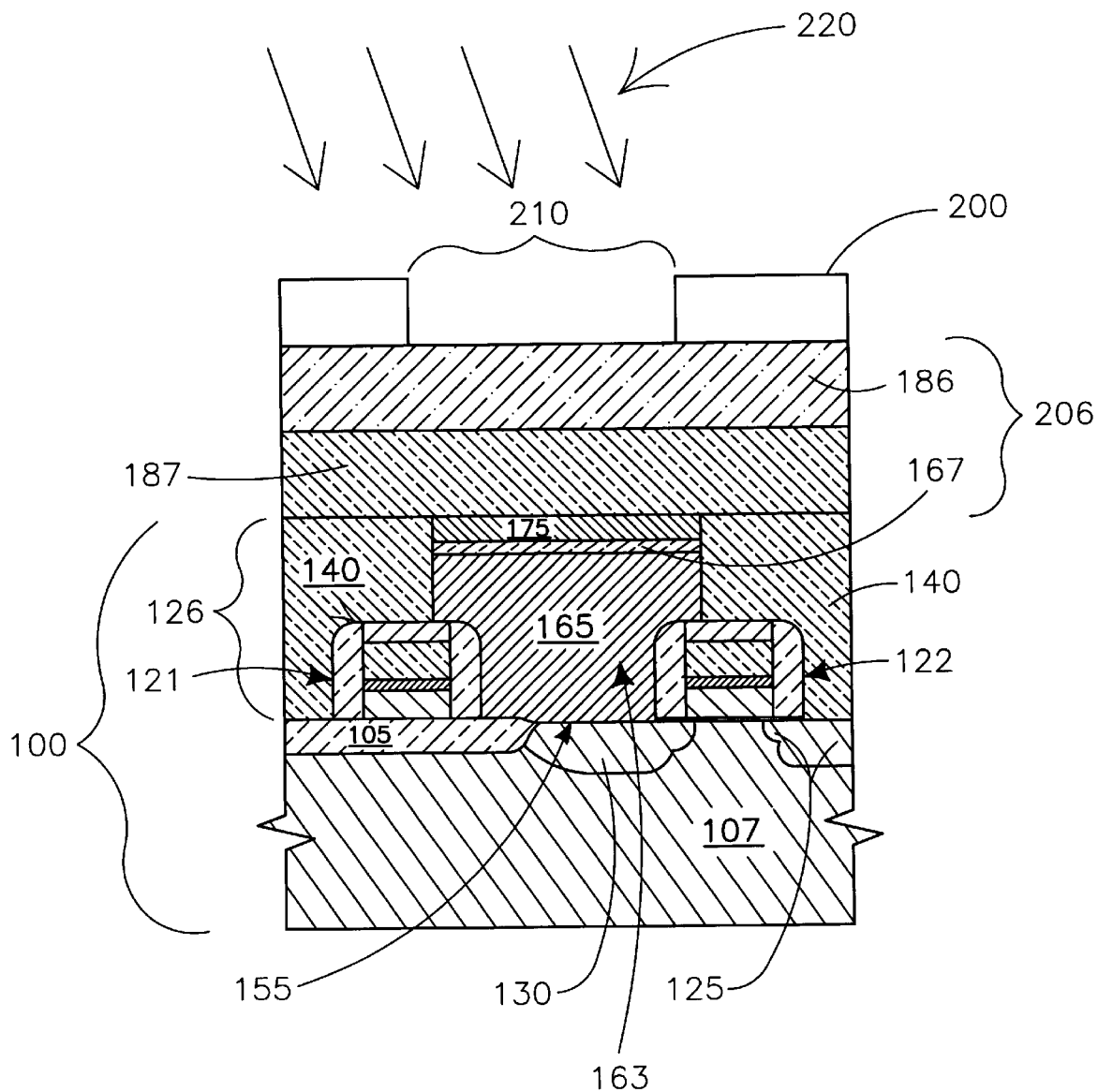
FIGS. 5A–5C illustrate the use of the method according to the present invention in a storage cell capacitor application.

As shown in FIG. 5A, a device structure 100 is fabricated in accordance with conventional processing techniques, and/or according to processing techniques described herein, through the formation of contact structure 163. Such processing is performed prior to depositing insulating material stack 206 upon which the etching method according to the present invention is utilized. As such, the device structure 100 includes field oxide regions 105 and active regions, i.e., those regions of the substrate 107 not covered by field oxide. Word line 121 and field effect transistor 122 are formed relative to field oxide regions 105 in the active regions, and suitable source/drain regions 125, 130 are created in silicon substrate 107. The insulating layer 126, which may include insulating layers such as described with reference to FIGS. 4A–4C, are formed over regions of FET 122 and word line 121. A polysilicon plug 165 is formed to provide electrical communication between the substrate 107 and the storage cell capacitor to be formed thereover. Various barrier layers may be formed over the polysilicon plug 165, including layers 167 and 175. For example, such layers may be titanium nitride, tungsten nitride, or any other metal nitride which acts as a barrier. Thereafter, insulating material stack 206 is formed and an opening 210 is defined therein using the method according to the present invention.

Figure 5B:
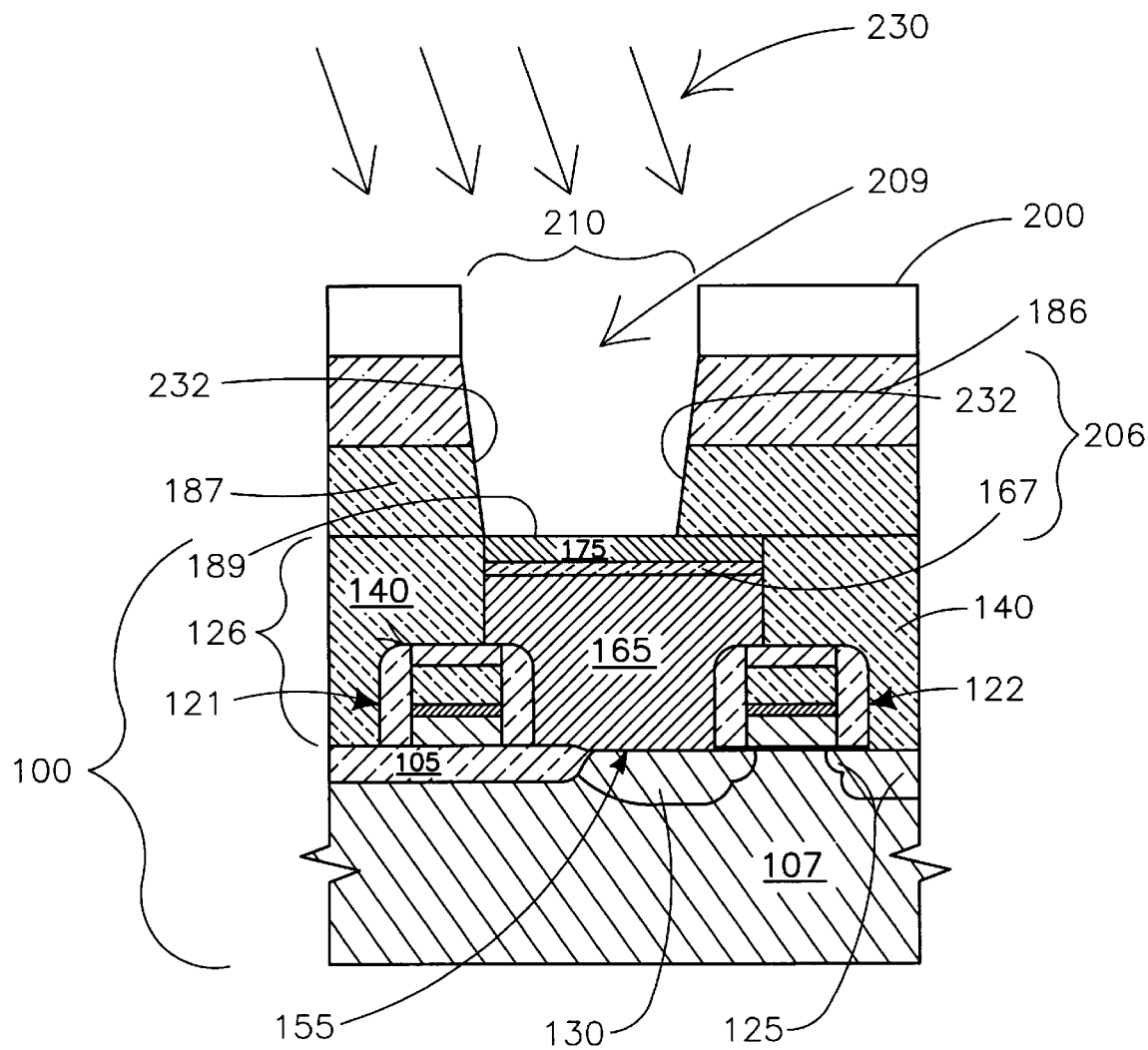
Figure 5C:
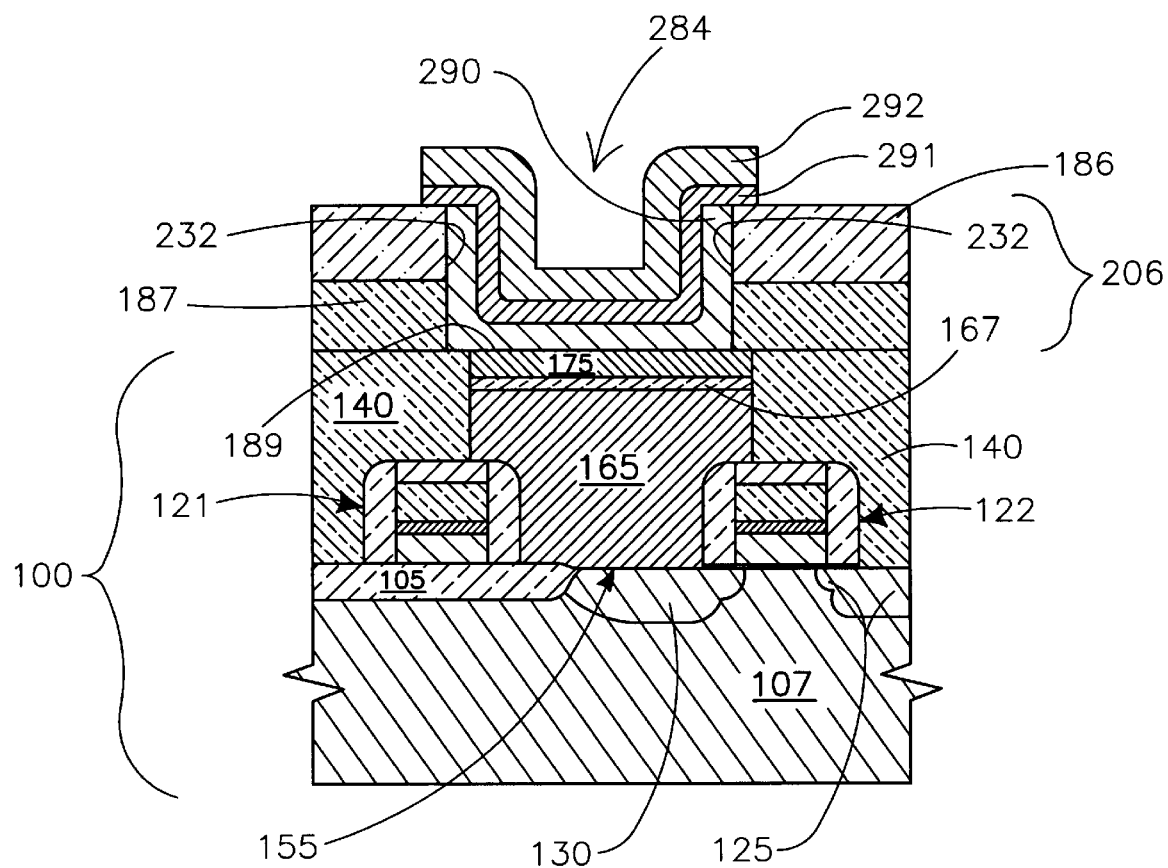

As shown in FIG. 5A, a mask layer 200 is patterned to define opening 210 in the insulating material stack 206. Insulating material stack 206 is formed over the device structure 100 as shown in FIG. 5A and as previously described herein with reference to FIGS. 1–3. For example, the first and second insulating material layers 1186, 187 include dissimilar insulating materials as previously described herein. Thereafter, a dry etch 220, as previously described herein, is used to form initial opening 209 in the insulating material stack 206, as shown in FIG. 5B. The dry etch 220 is an etch as previously described herein with reference to FIGS. 1–3. Thereafter, as shown in FIG. 5B, the device structure is subjected to a wet etch composition 230, such as by immersion, to form an opening defined by improved profile walls 232 and bottom surface 189 as shown in FIG. 5C. As previously described herein, the dry etch 220 provides for the initial opening 209 defined by walls 232 and bottom surface 189. However, the dry etch does not provide for desirable slope of the walls, and as such the wet etch composition is used in conjunction with the multi-layer insulating material stack 206 to provide for improved slope of the side walls 232 defining opening 209. In other words, the wet etch composition extends the opening 209 of the dry etch 220 to provide for an improved profile opening wherein a capacitor can be formed.

After the initial opening 209 is extended by the wet etch, as shown in FIG. 5C, a bottom electrode structure 187 is formed on the surfaces defining the opening. Thereafter, a dielectric layer 291 is formed relative to the electrode structure 187. For example, the dielectric layer may be of any suitable materials having a desirable dielectric constant. For example, the dielectric layer may be a high dielectric material such as $Si_3N_4$, $Ta_2O_5$, $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. Further, after the dielectric material 291 is formed on at least a portion of the bottom electrode structure 187, a second electrode structure 292 is formed over at least a portion of the dielectric structure 291.

It will be recognized by one skilled in the art that either one or both of the electrodes of the capacitor may be formed using any number of conductive layers. Further, for example, such an electrode may be formed of any conductive material such as platinum, titanium nitride, tungsten nitride, doped polysilicon, HSG, etc.

Further, it will be recognized by one skilled in the art that various capacitors may benefit according to the present invention. For example, the present methods may be beneficial for a container capacitor storage cell as described in U.S. Pat. No. 5,270,241 to Dennison et al., entitled, "Optimized Container Stack Capacitor DRAM Cell Utilizing Sacrificial Oxide Deposition And Chemical Mechanical Polishing," issued Dec. 14, 1993.

It will be recognized that by providing near vertical side walls for openings, e.g., high aspect ratio openings, for such capacitor structures, a significant increase in cell capacitance for a given height of the capacitor structure is attained. For example, by increasing the slope to near vertical for the side walls 232, as shown in FIG. 5C, as opposed to forming the capacitor in opening 209, the functional area of the capacitor is increased, leading to increased capacitance.

EXAMPLE 1

For control purposes, a photoresist patterning process conventional in the art was used to etch 0.3 micron critical dimension features in a rich BPSG layer of SACVD BPSG having a thickness of about 18K Å deposited on a wafer. The rich SACVD BPSG had a boron concentration of 3.8% and a phosphorous concentration of 6.9%.

The control process used a dry etch performed using a high density plasma etcher available from Applied Materials, Inc. under the following conditions:

Power of about 700 watts.

Bias power of about 700 watts.

Temperature of about 35° C.

Pressure of about 20 millitorr.

Flows of gases into the chamber included $C_2HF_5$ at a flow rate of about 12 sccm, $CHF_3$ at a flow rate of about 13 sccm, and $CH_2F_2$ at a flow rate of about 12 sccm.

Upon etching at the above parameters, and after a 75 second dilute HF clean, the top critical dimension of the opening or features etched in the rich BPSG layer had a mean value of about 0.3 microns and bottom critical dimensions of the openings etched had a mean value of about 0.2.

EXAMPLE 2

HF cleaned silicon wafers including a 10K Å rich BPSG layer formed thereon and an 8K Å standard BPSG layer formed on the rich BPSG layer were provided. The rich BPSG layer included a boron concentration of about 3.8% and a phosphorous concentration of about 6.9%. The standard BPSG layer included a boron concentration of about 3.0% and a phosphorous concentration of about 6.0%. Further, the rich BPSG layer was rapid thermally processed at the parameters of 950° C., in nitrogen, for 20 seconds and furnace densified at the parameters of 750° C., in nitrogen, for 30 minutes. The standard BPSG layer was also rapid thermally processed at the parameters of 950° C., in nitrogen, for 20 seconds, but was not furnace densified.

Using an etching method according to the present invention, a dry etch as described above in Example 1 was used to etch 0.3 micron patterned features in the insulating layers. Thereafter, a 10 minute wet etch using APM was performed. The wafers were immersed in the APM at a temperature of about 55° C.

After the wafers were cleaned with a 75 second dilute HF/TMAH clean, the critical dimensions of the features were measured. The top critical dimension of the opening or features etched in the insulating layer stack had a mean value of about 0.3 microns and bottom critical dimensions of the openings etched had a mean value of about 0.275. As such, a considerable increase in the vertical nature of the walls defining the openings was achieved using the present invention.

EXAMPLE 3

HF cleaned silicon wafers including a 9K Å rich BPSG layer formed thereon and a 9K Å standard BPSG layer formed on the rich BPSG layer were provided. The rich BPSG layer included a boron concentration of about 3.8% and a phosphorous concentration of about 6.9%. The standard BPSG layer included a boron concentration of about 3.0% and a phosphorous concentration of about 6.0%. Further, the rich BPSG layer was rapid thermally processed and furnace densified at the parameters as described with reference to Example 2. The standard BPSG layer was also rapid thermally processed at the parameters as described in Example 2, but was not furnace densified.

Using an etching method according to the present invention, a dry etch as described above in Example 1 was used to etch 0.3 micron patterned features in the insulating layers. Thereafter, a two minute hot phosphorous acid etch at a temperature of about 158° C. with an aqueous phosphorous acid having a concentration of 85% by volume was performed. The wafers were immersed in the solution.

After the wafers were cleaned with a 60 second dilute HF/TMAH clean, the critical dimensions of the features were measured. The top critical dimension of the opening or features etched in the insulating layer stack had a mean value of about 0.33 microns and bottom critical dimensions of the openings etched had a mean value of about 0.30. As such, a considerable increase in the vertical nature of the walls defining the openings was achieved using the present invention.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the insulating material structure and methods of etching as described herein to provide improved profile for semiconductor device structures. Various modifications of the illustrative embodiments, as well as additional embodiments of the invention, will be apparent to persons skilled in the art upon reference to this description. It is therefore contemplated that the patented claims will cover any such modifications or embodiments that may fall within the scope of the present invention as defined by the accompanying claims.

What is claimed is:

1. An etching method comprising:
   providing a first insulating material layer on a substrate assembly surface;
   providing a second insulating material layer on the first insulating material layer, wherein the first and second insulating material layers are formed of dissimilar oxide materials, and further wherein the first insulating material layer has an etch rate that is greater than the etch rate of the second insulating material layer when exposed to an etch composition;
   patterning a mask layer over the first and second insulating layers; and
   removing portions of both the first insulating material layer and the second insulating material layer simultaneously using at least the etch composition.

2. The method of claim 1, wherein the first insulating material layer has an etch rate about 1.5 times or more greater than the etch rate of the second insulating material layer when exposed to the etch composition.

3. The method of claim 1, wherein the etch composition is a wet etch composition.

4. The method of claim 3, wherein removing portions of both the first insulating material layer and the second insulating material layer simultaneously using at least the wet etch composition includes:
   removing portions of the first and second insulating material layers exposed by the patterned mask layer using a plasma etch resulting in an initial opening therein, the initial opening defined by at least one wall having a slope of less than about 88 degrees; and
   exposing portions of both the first and second insulating material layers simultaneously to the wet etch composition to further extend the initial opening such that the slope of the at least one wall is in the range of about 88 degrees to 90 degrees.

5. The method of claim 1, wherein the opening is a high aspect ratio opening, wherein the high aspect ratio opening has an aspect ratio greater than 1 and a critical dimension of less than 1 micron.

6. The method of claim 1, wherein the first and second insulating material layers are formed of dissimilar doped silicate glass.

7. The method of claim 6, wherein one of the first and second insulating material layers is formed of BPSG and the other of the first and second insulating material layers is formed of PSG.

8. The method of claim 6, wherein both the first and second insulating material layers are formed of PSG but at different dopant levels.

9. The method of claim 6, wherein both the first and second insulating material layers are formed of BPSG but at different dopant levels.

10. A method of forming an opening comprising:
    providing a first insulating material layer on a substrate assembly surface;
    providing a second insulating material layer on the first insulating material layer, wherein the first and second insulating material layers are formed of dissimilar oxide materials, and further wherein the first insulating material layer has an etch rate that is about 1.5 times or more greater than the etch rate of the second insulating material layer when exposed to a wet etch composition;
    patterning a mask layer over the first and second insulating layers;
    removing portions of the first and second insulating material layers exposed by the mask layer using a plasma resulting in an initial opening therein, the initial opening defined by at least one wall having a slope relative to horizontal; and
    wet etching portions of both the first and second insulating material layers exposed by the patterned mask layer simultaneously using the wet etch composition to further extend the initial opening such that the at least one wall becomes more vertical relative to the horizontal.

11. The method of claim 10, wherein the initial opening is defined by at least one wall having a slope of less than about 88 degrees after portions of the first and second insulating material layers are removed using the plasma, and further wherein the slope of the at least one wall after the wet etch is in the range of about 88 degrees to 90 degrees.

12. The method of claim 10, wherein removing portions of the first and second insulating material layers using the plasma includes dry etching the first and second insulating material layers using a fluorine containing plasma.

13. The method of claim 10, wherein the wet etch composition includes an ammonium hydroxide and hydrogen peroxide aqueous solution.

14. The method of claim 10, wherein the wet etch composition includes a phosphoric acid aqueous solution.

15. The method of claim 10, wherein the opening is a high aspect ratio opening, wherein the high aspect ratio opening has an aspect ratio greater than 6 and a critical dimension of less than 1 micron.

16. The method of claim 10, wherein the first and second insulating material layers are formed of dissimilar doped silicate glass.

17. The method of claim 16, wherein one of the first and second insulating material layers is formed of BPSG and the other of the first and second insulating material layers is formed of PSG.

18. The method of claim 16, wherein both the first and second insulating material layers are formed of PSG but at different dopant levels.

19. The method of claim 16, wherein both the first and second insulating material layers are formed of BPSG but at different dopant levels.

20. A method of forming an opening comprising:

providing a first insulating material layer on a substrate assembly surface;

providing a second insulating material layer on the first insulating material layer, wherein the first and second insulating material layers are formed of dissimilar doped silicate glass, and further wherein the first insulating material layer has an etch rate that is about 1.5 times or more greater than the etch rate of the second insulating material layer when exposed to an etch composition;

patterning a mask layer over the first and second insulating layers;

dry etching portions of the first and second insulating material layers exposed by the patterned mask layer resulting in an initial opening therein, the initial opening defined by at least one wall having a slope relative to horizontal; and wet etching portions of both the first and second insulating material layers exposed by the mask layer simultaneously using the wet etch composition to further extend the initial opening such that the slope of the at least one wall becomes more vertical relative to horizontal after the wet etch compared to the slope of the at least one wall after the dry etching.

21. The method of claim 20, wherein one of the first and second insulating material layers is formed of BPSG and the other of the first and second insulating material layers is formed of PSG.

22. The method of claim 20, wherein both the first and second insulating material layers are formed of PSG but at different dopant levels.

23. The method of claim 20, wherein both the first and second insulating material layers are formed of BPSG but at different dopant levels.

24. The method of claim 23, wherein the first insulating material layer is formed of rich BPSG including about 3.0% by weight to about 3.8% by weight of boron and about 6.5% by weight to about 9.0% by weight of phosphorus, and further wherein the second insulating material layer is formed of standard BPSG including less than about 3.0% by weight of boron and less than about 6.0% by weight of phosphorus.

25. The method of claim 20, wherein at least one of the first and second insulating material layers are densified layers.

26. The method of claim 20, wherein the initial opening is defined by at least one wall having a slope of less than about 88 degrees after the first and second insulating material layers are dry etched, and further wherein a slope of the at least one wall after the wet etch is in a range of about 88 degrees to 90 degrees.

27. An etching method comprising:

providing at least two insulating material layers forming a stack of insulating layers on a substrate assembly surface, wherein a first insulating material layer of the at least two insulating layers provided on the substrate assembly surface has an etch rate that is about 1.5 times or more greater than the etch rate of any of the other insulating material layers of the stack of insulating layers when exposed to a wet etch composition;

patterning a mask layer over the stack of insulating layers;

removing portions of the stack of insulating layers exposed by the mask layer using a plasma resulting in an initial opening therein, the initial opening defined by at least one wall having a slope of less than about 88 degrees; and further removing portions of each layer of the stack of insulating layers simultaneously using the wet etch composition to further extend the initial opening such that the slope of the at least one wall defining the initial opening is formed to be in a range of about 88 degrees to 90 degrees.

28. A method for forming a capacitor, the method comprising:

providing a first insulating material layer on a substrate assembly surface;

providing a second insulating material layer on the first insulating material layer, wherein the first and second insulating material layers are formed of dissimilar oxide materials, and further wherein the first insulating material layer has an etch rate that is about 1.5 times or more greater than the etch rate of the second insulating material layer when exposed to a wet etch composition;

patterning a mask layer over the first and second insulating layers;

removing portions of the first and second insulating material layers exposed by the patterned mask layer using a fluorine containing plasma resulting in an initial opening therein;

further removing portions of the first and second insulating material layers simultaneously using the wet etch composition to further extend the initial opening such that a slope of at least one wall defining the extended opening is in a range of about 88 degrees to 90 degrees;

forming a first electrode structure in the extended opening;

forming a dielectric layer on at least a portion of the first electrode structure; and forming a second electrode structure on at least a portion of the dielectric layer.

29. The method of claim 28, wherein removing portions of the first and second insulating material layers using a plasma results in an initial opening defined by at least one wall having a slope of less than about 88 degrees, wherein the slope of the at least one wall of the initial opening is formed by the wet etch composition to be within the range of about 88 degrees to 90 degrees.

30. The method of claim 28, wherein the opening is a high aspect ratio opening, wherein the high aspect ratio opening has an aspect ratio greater than 6 and a critical dimension of less than 1 micron.

31. The method of claim 28, wherein the first and second insulating material layers are each formed of dissimilar doped silicate glass.

32. A method for forming a contact of a memory device, the method comprising:
- providing a first insulating material layer on at least a surface of a drain/source of an active area;
- providing a second insulating material layer on the first insulating material layer, wherein the first and second insulating material layers are formed of dissimilar oxide materials, and further wherein the first insulating material layer has an etch rate that is about 1.5 times or more greater than the etch rate of the second insulating material layer when exposed to a wet etch composition;
- patterning a mask layer over the first and second insulating layer to define a contact opening in the first and second insulating material layers;
- removing portions of the first and second insulating material layers exposed by the patterned mask layer using a fluorine containing plasma resulting in an initial opening therein;
- further removing portions of the first and second insulating material layers simultaneously using the wet etch composition to extend the initial opening resulting in the contact opening extending to the semiconductor substrate surface, wherein a slope of at least one wall defining the extended opening is in a range of about 88 degrees to 90 degrees; and
- providing at least one conductive material in the contact opening.

33. The method of claim 32, wherein removing portions of the first and second insulating material layers using the plasma results in an initial opening defined by at least one wall having a slope of less than about 88 degrees, wherein the slope of the at least one wall of the initial opening is formed by the wet etch composition to be within the range of about 88 degrees to 90 degrees.

34. The method of claim 32, wherein the opening is a high aspect ratio opening, wherein the high aspect ratio opening has an aspect ratio greater than 6 and a critical dimension of less than 1 micron.

35. The method of claim 32, wherein the first and second insulating material layers are formed of dissimilar oxide materials.

36. The method of claim 32, wherein the first and second insulating material layers are formed of dissimilar doped silicate glass.

* * * * *